(12) United States Patent
Siglinger et al.

(10) Patent No.: US 6,946,850 B2
(45) Date of Patent: Sep. 20, 2005

(54) METHOD AND APPARATUS FOR FILTERING UNWANTED NOISE WHILE AMPLIFYING A DESIRED SIGNAL

(75) Inventors: Paul R. Siglinger, Fort Worth, TX (US); William C. Wood, Fort Worth, TX (US)

(73) Assignee: Tempo Research Corporation, Cincinnati, OH (US)

( * ) Notice: Subject to any disclaimer, the term of this patent is extended or adjusted under 35 U.S.C. 154(b) by 130 days.

(21) Appl. No.: 10/057,752

(22) Filed: Oct. 25, 2001

(65) Prior Publication Data

US 2003/0080752 A1 May 1, 2003

(51) Int. Cl.[7] ............................................. G01R 29/26
(52) U.S. Cl. ...................... 324/613; 333/14; 455/296
(58) Field of Search ................... 324/613, 66; 333/14; 455/67.1, 67.3, 67.4, 67.7, 296

(56) References Cited

U.S. PATENT DOCUMENTS

| | | | |
|---|---|---|---|
| 3,628,138 A | 12/1971 | Collier et al. | |
| 3,882,287 A | 5/1975 | Simmonds | |
| 3,907,136 A | 9/1975 | Christides et al. | |
| 4,061,874 A | * 12/1977 | Fricke et al. ................. | 381/57 |
| 4,381,488 A | 4/1983 | Fricke et al. | |
| 4,431,875 A | 2/1984 | Simokat | |
| 4,458,113 A | 7/1984 | Tolman | |
| 4,542,532 A | 9/1985 | McQuilkin | |
| 4,812,743 A | 3/1989 | Morrison | |
| 4,996,484 A | 2/1991 | Spies | |
| 5,193,108 A | * 3/1993 | Stocklin ...................... | 324/555 |
| 5,577,099 A | 11/1996 | Clement et al. | |
| 6,226,356 B1 | 5/2001 | Brown | |
| 6,317,613 B1 | * 11/2001 | Brown, Jr. .................. | 455/570 |

OTHER PUBLICATIONS

Philips Semiconductors; AN176 Compandor Cookbook; Aug. 20, 1997; pp 10–2 through 10–7.
Electronic Design; Simple Addition to Logarithmic Compressor Reduces Noise; Ron Swenson and Jared Bytheway; May 29, 2001; Temperature–Compensated LCD Bias Supply Uses A Single Control IC, Dave Kim, Wide–Range Programmable Negative Regulator Conserves Power, Kevin R. Hopkins; pp 1–6.

* cited by examiner

Primary Examiner—Anjan Deb
Assistant Examiner—Timothy J. Dole
(74) Attorney, Agent, or Firm—Pillsbury Winthrop Shaw Pittman LLP

(57) ABSTRACT

A method and an apparatus for detecting signals in an electromagnetically noisy environment by detecting electromagnetic signals comprising a noise signal and a known signal, and compressing the electromagnetic signal to thereby generate a compressed signal. The compressed signal is filtered to generate a filtered signal comprising substantially the known signal, and the filtered signal is expanded.

20 Claims, 9 Drawing Sheets

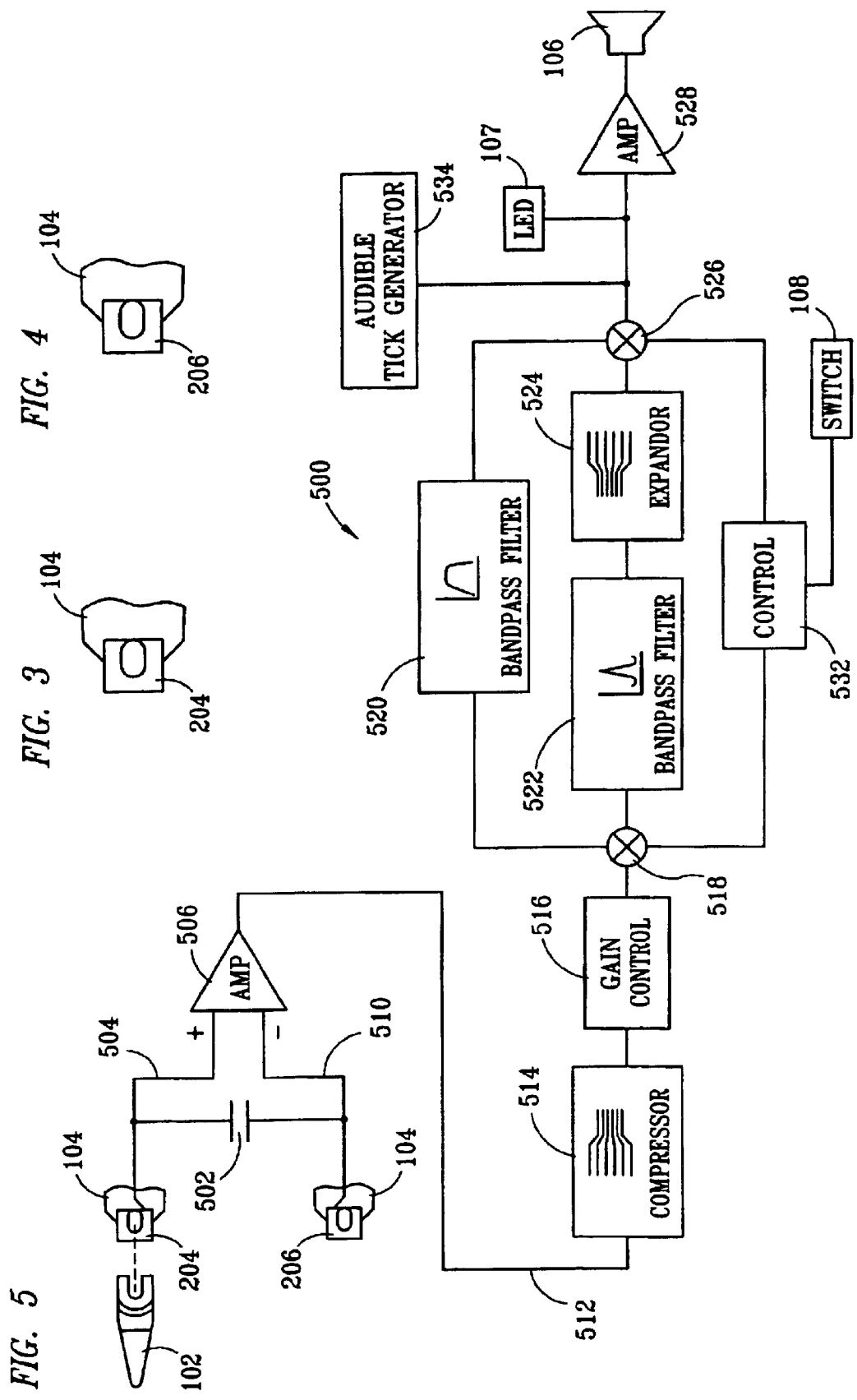

METHOD AND APPARATUS FOR FILTERING UNWANTED NOISE WHILE AMPLIFYING A DESIRED SIGNAL

BACKGROUND

Devices used to trace and detect audio signals on metallic conductors are commonly referred to as tone detectors, inductive amplifiers, or tone probes. These devices are used by telecommunications personnel, Local Area Network (LAN) personnel, Wide Area Network (WAN) personnel, cable television personnel, or by any persons wishing to locate and identify a particular conductor. Tone probes couple to a conductor electromagnetically, amplify the signal, and output the audio signal to a speaker or headset so the user can hear the signal on the conductor.

Tone probes are often used in conjunction with a tone generator or tone sender. The tone generator transmits a known or characteristic electrical signal at one or several audio frequencies. The tone generator is attached to a conductor at a known location and transmits over the conductor to a location where the conductor is to be identified using the tone probe. The distance between the transmitter and identification location may be from several feet to many miles. If the distance from the tone generator is many miles, the locating signal will be attenuated. Additionally, the conductor that is to be identified may be in a cable with many other metal conductors or wires. Often other wires and conductors are carrying other signals that induce noise onto the pair that is carrying the locating signal. Thus, the undesired noise signals may be at a higher level than the locating signal and the locating signal will be undetectable by a user using most common tone probes.

Conventional tone probes may be either unfiltered or filtered. An unfiltered tone probe converts all electrical signals that it receives in an audio frequency range to an audio signal. A tone signal sent by the tone generator can be easily detected if the environment in which the signal is being received is noiseless. The user must discriminate between noise and signal if noise is present where the conductor is being identified. The signal may not be identified at all if noise signals are so strong that the user cannot discriminate the tone.

Filtered probes assist the user by attempting to reduce the unwanted noise signals, thereby making the signal of interest more distinctive and easier to discriminate and locate. Filtration available today consists of low pass, high pass, band pass, and comb filtration.

Low pass and high pass filtration filters electrical signals above and below a certain frequency, as implied by the name. Tone probes designed with these types of filters have a cutoff frequency that is selected to reduce most of the noise, while passing the signal of interest. The filter also passes audio frequencies below or above the cutoff. These filters are often inadequate because noise can still dominate in those portions of the audio spectrum.

Some probes use band pass filtration that passes frequencies only related to the signal of interest and attenuates all other signals to a certain percentage. Band pass filters attenuate the noise signals better, but are often insufficient if the signal of interest is low in amplitude and the noise signals are high. Noise often still dominates the output of the tone probe in this case.

Much of the predominant noise on cables installed by various utilities is caused by power influence, or 60 Hz AC induction. Noise in these situations exists at 60 Hz and its harmonics. That is, energy in the electromagnetic spectrum will exist at multiples of 60 Hz (e.g., at 60, 120, 180, 240, 360, and continuing up the frequency spectrum at multiples of 60 Hz). Comb filters in tone probes are designed to notch out or attenuate the 60 Hz harmonics and pass all other frequencies of interest. If other noise is present, or the power influence is not precisely at 60 Hz, this method may become inadequate as well.

Accordingly, a continuing search has been directed to the development of methods and apparatuses that can filter out noise while amplifying a desired signal, so that tones may be readily detected in relatively noisy environments.

SUMMARY

The present invention provides a method and system that can readily detect tones in relatively noisy environments. According to the present invention electromagnetic signals comprising a noise signal and a tone signal are detected and compressed to thereby generate a compressed signal. The compressed signal is filtered to generate a filtered signal comprising substantially the tone signal, and the filtered signal is expanded. Alternatively, the signal is either compressed or expanded, before or after filtration.

BRIEF DESCRIPTION OF THE DRAWINGS

For a more complete understanding of the present invention, and the advantages thereof, reference is now made to the following descriptions taken in conjunction with the accompanying drawings, in which:

FIG. 3 is a top view of a probe antenna receiver taken along the line 3—3 of FIG. 2, and extending from the circuit board of FIG. 2;

FIG. 4 is a bottom view of a noise canceling antenna taken along the line 4—4 of FIG. 2, and extending from the circuit board of FIG. 2;

FIG. 5 is a schematic diagram illustrating circuitry implemented on the circuit board of FIG. 2;

DETAILED DESCRIPTION

In the following discussion, numerous specific details are set forth to provide a thorough understanding of the present invention. However, it will be obvious to those skilled in the art that the present invention may be practiced without such specific details. In other instances, well-known elements have been illustrated in schematic or block diagram form in order not to obscure the present invention in unnecessary detail. Additionally, for the most part, details concerning electronic signal compressors and expanders and the like have been omitted inasmuch as such details are not considered necessary to obtain a complete understanding of the present invention, and are considered to be within the skills of persons of ordinary skill in the relevant art.

Figure 1:
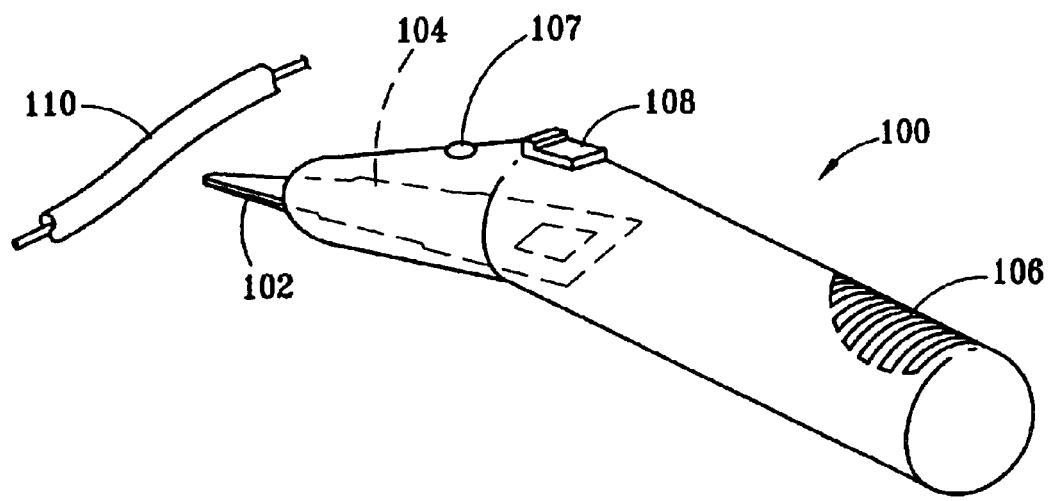
FIG. 1 is a perspective view of an assembled probe housing circuitry of the present invention.

Referring to FIG. 1 of the drawings, the reference numeral 100 generally designates a preferred tone probe configured for housing filtration circuitry embodying features of the present invention. The assembly includes a probe antenna 102 extending from a circuit board 104, shown in phantom and discussed further below with respect to FIGS. 2–10, a speaker 106 and light emitting diode (LED) 107, discussed further below with respect to FIGS. 5–10, and a switch 108, such as a thumb switch, connected to the circuit board 104 contained within the housing of the probe 100, and discussed below with respect to FIGS. 5–10. As shown in FIG. 1, the tone probe 100 is positioned so that the probe antenna 102 is proximate to a conductor 110, such as a telephone wire, for determining whether a tone signal, or any other know signal, is being passed through it, as described further below with respect to FIGS. 5–10.

Figure 2:
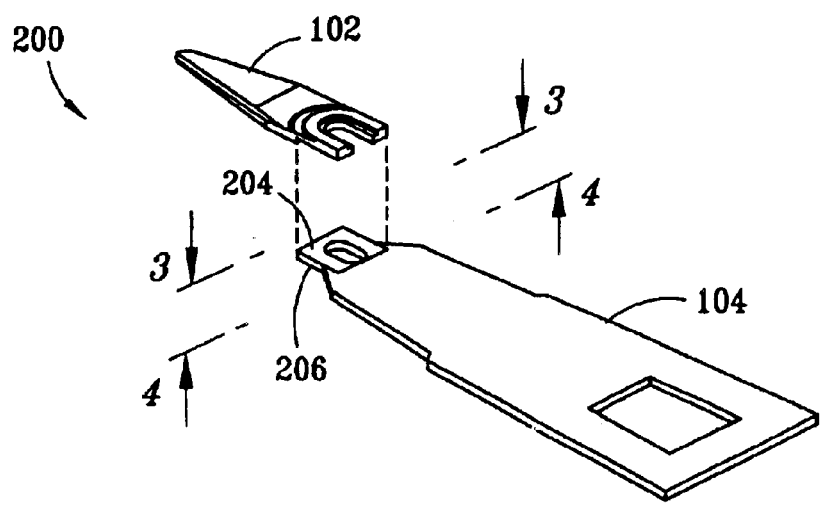
FIG. 2 is a exploded perspective view of a circuit board and antenna contained within the housing of FIG. 1.

FIG. 2 depicts an exploded view of the circuit board assembly 200 contained within the probe assembly 100 of FIG. 1. The assembly 200 includes the circuit board 104 having an antenna portion 204 onto which the probe antenna 102 is positioned, and from which the antenna 102 extends. The antenna 102 is preferably fabricated from conductive plastic having a volume resistivity of about $10^3$ to $10^6$ ohm-cm. A noise canceling antenna 206, discussed below with respect to FIG. 4, is formed on a bottom side (as viewed in FIG. 2) of the circuit board 104 opposing the portion 204, and is preferably removed by about 1 to 2 inches from the tip of the probe antenna 102. While not shown in FIG. 2, the circuit board 104 also includes certain electrical circuit components, many of which are discussed further below with respect to FIGS. 5–10.

FIGS. 3 and 4 depict antenna portion 204 and antenna 206, respectively, of the circuit assembly 104. The antennas portion 204 and antenna 206 preferably comprise substantially identical traces bonded to opposing sides of the circuit board 104 in a conventional manner. The portion 204 is further configured in combination with the housing of the probe 100 to receive and secure the antenna 102 in place.

Referring to FIG. 5 of the drawings, the reference numeral 500 generally designates analog filtration circuitry preferably mounted onto the circuit board 104 and embodying features of the present invention. The filtration system 500 includes the probe antenna 102 mounted on the antenna portion 204 connected to a positive input terminal 504 of a differential amplifier 506, and the noise canceling antenna 206 connected to a negative input terminal 510 of the amplifier 506. Because the antenna portion 204 and antenna 206 are positioned on opposing sides of the circuit board 104, there is formed a capacitive connection 502 between them. The probe antenna 102 is preferably configured for sensing electromagnetic fields proximate to the conductor 110 that has a tone signal, and passing the signal through antenna portion 204 to the input terminal 504 of the amplifier 506. The noise canceling antenna 206 is configured for sensing ambient electromagnetic fields, or noise signals, that substantially do not contain the desired tone, and for passing the noise signal to the negative terminal 510 of the amplifier 506. The amplifier 506 preferably has a minimum gain bandwidth of 1.7 MHz, a minimum slew rate of 3.6 volts per microsecond, a high input impedance of $10^{12}$ ohms, and is operable from a single supply voltage at 5 volts. Furthermore, the amplifier 506 is configured for inverting the noise signal received on the input line 510 from the noise canceling antenna 206, and for then adding (i.e., summing) the inverted noise signal to the probe signal received from the probe antenna 102. The resulting summed signal is then amplified, and transmitted onto an output line 512 to an electronic compressor 514.

The electronic compressor 514 is configured for "compressing" the amplitudes of the signal received from the amplifier 506. More specifically, the compressor 514 compresses signals to effectively "normalize" them so that relatively small amplitude signals are amplified, and relatively large amplitude signals are attenuated. Such small and large signals thus become closer together in amplitude and, thus, easier to process. The compressor 514 is connected for transmitting a compressed signal to a gain controller 516, which permits a user to adjust the signal strength for ease in locating a conductor, and may optionally be omitted.

The gain controller 516 is connected to a switch 518. The switch 518 is connected for transferring the signal to either a relatively wide band bandpass filter 520, or a serially connected relatively narrow band bandpass filter 522 and electronic signal expandor 524. The wide band bandpass filter 520 and expandor 524 are also connected to a second switch 526 configured for transferring a signal output to the LED 107 and to an audio amplifier 528 and speaker 106. A control circuit 532 is connected to the switches 518 and 526 for controlling the switches so that the switches operate synchronously to control the path of signals. A "tick" signal generator 534 is optionally connected to the input of the amplifier 528 to generate a periodic tick signal which is made audible through the speaker 106 to indicate to a user that the probe 100 is in a mode of using the bandpass filter 522 and the expandor 524, and that the unit is powered on and working properly. The tick generator 534 preferably also causes the LED 107 to flash. The period of the tick signal is preferably every one to two seconds, though any desirable period may be used.

The switches 518 and 526 are preferably analog semiconductor switches, and the control circuit 532 may be any circuitry effective for controlling the switches 518 and 526. The control circuit 532 also includes the physical switch 108 positioned on the housing of the tone probe 100 for permitting a user to control the control circuit 532.

The wide band bandpass filter 520 is preferably an active analog filter, but may also be a passive analog filter, and is effective for substantially passing signals in a frequency defined within the bandwidth of a 3 dB passband, such as from about 707 Hz to about 3200 Hz. The narrow band bandpass filter 522 is preferably a biquad active analog filter, but may be either an active or passive filter effective for substantially passing signals having a frequency within a defined 3 dB passband bandwidth, such as, when the desired signal is 577 Hz, preferably from about 573 Hz to about 589 Hz. The expandor 524 is effective for amplifying relatively large amplitude signals, while attenuating relatively small amplitude signals, so that the desired signal passed by the filter 522 is amplified, and the noise signal filtered by the filter 522 is attenuated. The compressor 514, with the gain preferably limited by the circuit to 6 dB, and expandor 524 are preferably an analog compandor configured as a standard compressor/expandor, such as the Philips Compandor SA571, which may be obtained from Philips Semiconductors. The amplifier 528 is preferably a differential output audio amplifier operable from a single supply voltage of from about 3 to about 9 volts, having a minimum gain bandwidth of about 1.5 MHz, and a gain range in the audible range of from zero to about 46 dB. The amplifier 528 and speaker 106 may alternatively be replaced or used in conjunction with any suitable means for indicating the identification of a desired signal, such as light emitting diodes (LEDs), wherein the strength of a signal is indicated by the visible intensity of LEDs or by the number of which LEDs are illuminated. Additionally, an LCD or numeric LED indicator may be used to indicate signal strength.

In operation, a user (not shown) powers on the probe 100 and the tick generator 534 begins to generate a periodic tick signal which is made audible through the speaker 106 to indicate mode of operation (either conventional or in accordance with present invention) to the user and that the probe 100 is powered on. The user then indicates via the switch 108 whether the probe 100 should be used for detecting tone signals in a conventional manner, or in accordance with the present invention, as discussed below. The probe antenna 102 is then positioned adjacent to the conductor 110 for sensing any electromagnetic field, or tone signal, emitted from the conductor. Such tone signal detected by the probe antenna 102 is passed through antenna portion 204 to the positive input terminal 504 of the amplifier 506. Simultaneously, the noise canceling antenna 206, in proximity to the conductor 110, detects electromagnetic noise surrounding the conductor 110, and passes a noise signal to the negative input terminal 510 of the amplifier 506. The amplifier 506 then inverts the noise signal received from the noise canceling antenna 206 and adds (i.e., sums) the inverted noise canceling signal to the signal received from the probe antenna 102, to thereby reduce the noise in the signal, and send the resulting signal via the output line 512 to the compressor 514.

The compressor 514 compresses the signal received on the line 512 such that signals (e.g., noise) with relatively high amplitudes are attenuated, and signals with relatively low amplitudes (e.g., the tone signal) are amplified, with the result that differential between the amplitudes of the noise and tone signal are reduced. The resulting compressed signal is sent to the gain controller 516, wherein a user may adjust the signal strength for ease in locating a conductor 110. The LED 107 may be used in conjunction with the speaker 106 to indicate signal strength and thereby facilitate adjustment of the gain controller 516. Accordingly, while adjusting the gain controller 516, the LED 107 is effective as a threshold indicator to, thereby, make it easier for a user to identify a signal location at issue.

The signal from the gain controller 516 is sent to the switch 518 which is set by the control circuitry 532 to direct the signal to either the bandpass filter 520 or the bandpass filter 522. If the signal is directed via the control circuit 532 to the wide band bandpass filter 520, a signal is produced that is similar to a conventional signal produced by the prior art. The signal is then passed to the switch 526, and then to the LED 107 and amplifier 528 which amplifies the signal. The amplified signal is sent to the speaker 106 which then makes an audible sound indicative of the signal detected on the line 110.

If the signal is directed to the narrow band bandpass filter 522, a narrow bandwidth of frequencies, including the desired tone signal frequency, is passed. Some of the noise outside the frequency range of the filter passes through the filter 522, but at a significantly lower amplitude than the noise and tone signal within the band. The filtered signal is passed to the expandor 524, which amplifies the relatively high amplitude frequencies, substantially including the desired tone signal, within the pass band of the filter 522, and which may include a relatively small amount of noise within the range of the pass band. The small amount of noise outside the pass band frequency range that bleeds through the filter 522 is attenuated. The signal is then passed from the expandor 524 through the switch 526 to the amplifier 528 and speaker 106 as discussed above with respect to the signal directed to the bandpass filter 520.

By the use of the present tone probe described above, unwanted noise is filtered out while a desired signal is amplified. Thus tones may be readily detected in relatively noisy environments that may not be detected using conventional techniques.

Figure 6:
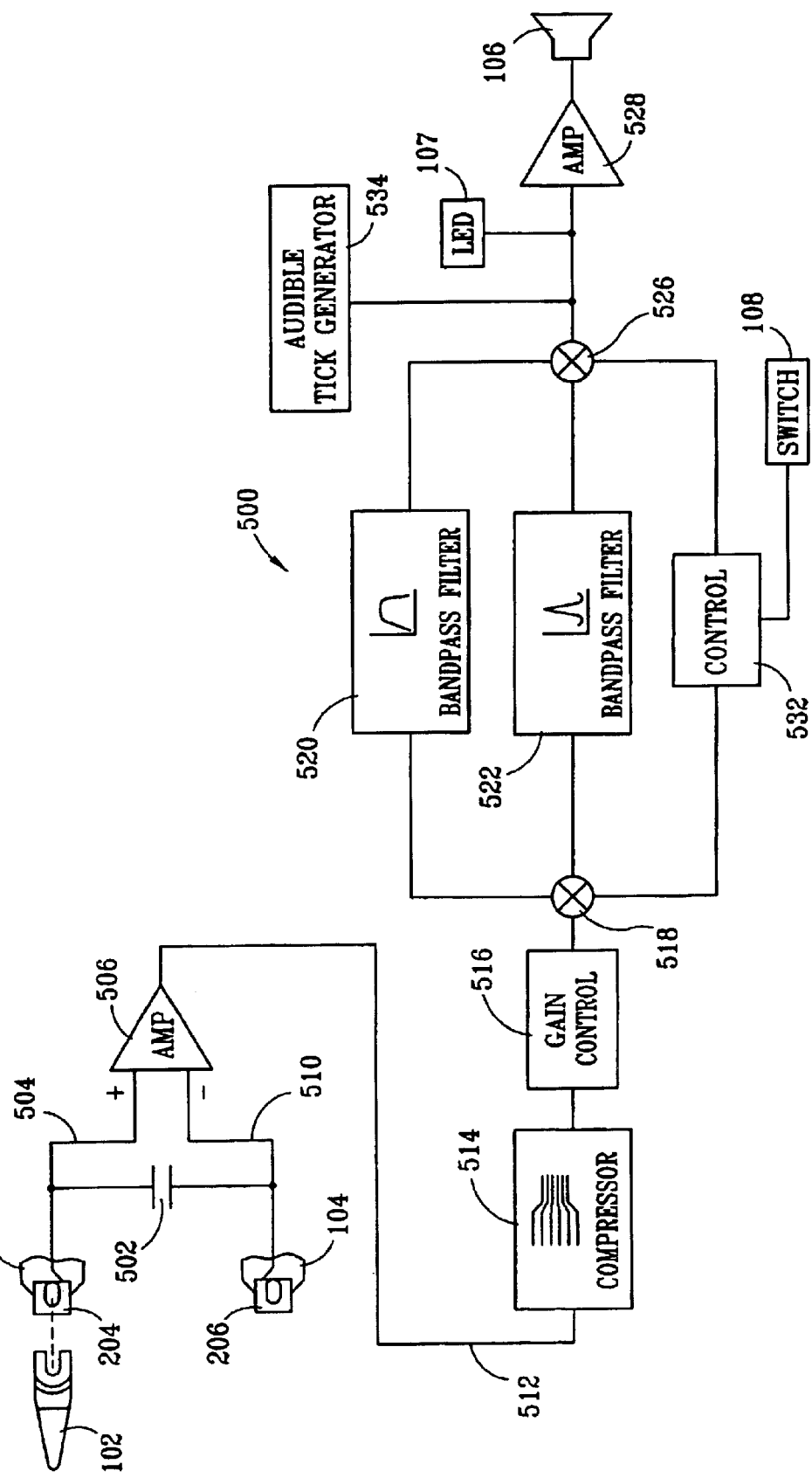
FIGS. 6, 7, 7A, and 7B are schematic diagrams illustrating alternate embodiments for implementing the circuitry of FIG. 5.
Figure 7:
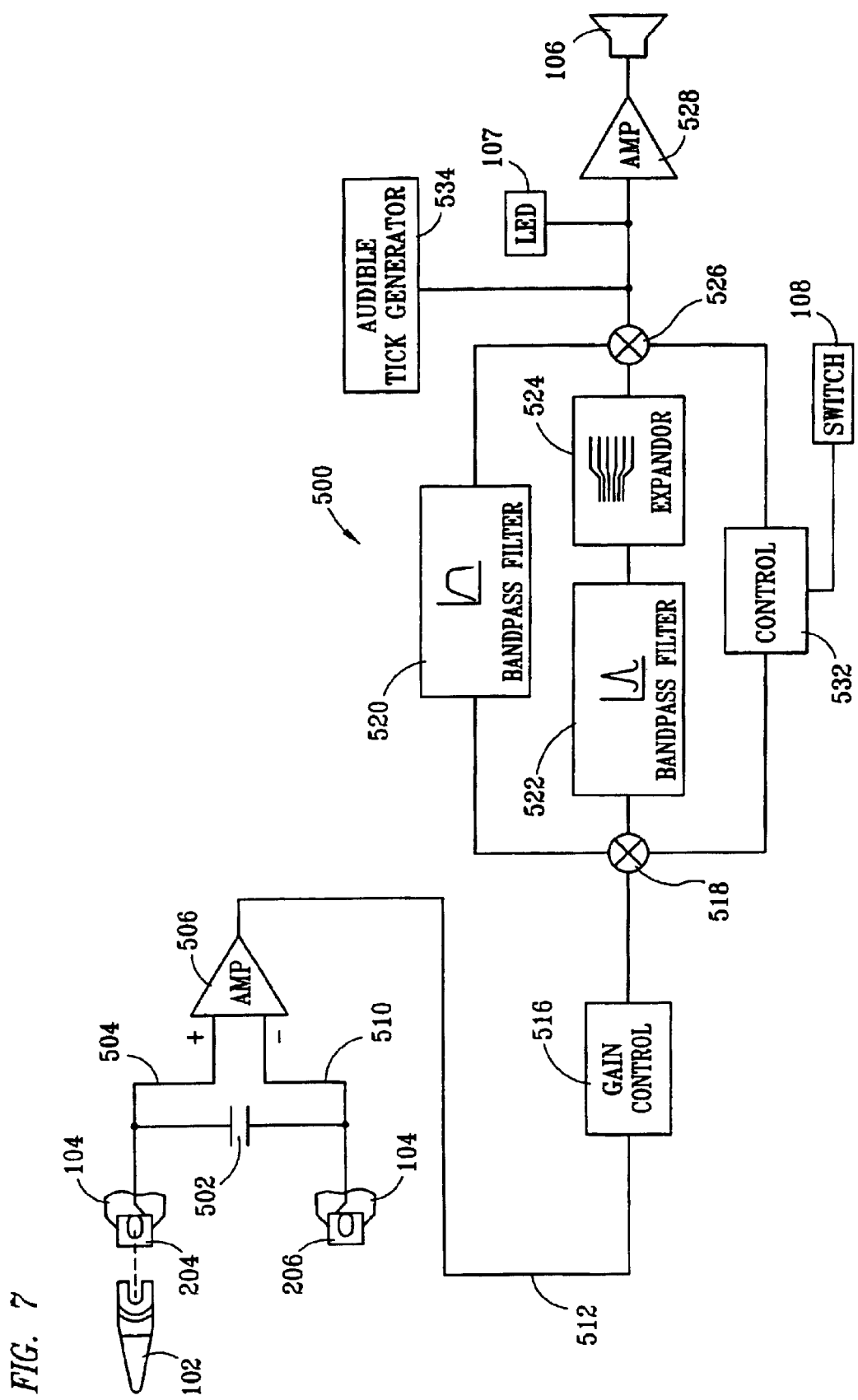
Figure 7A:
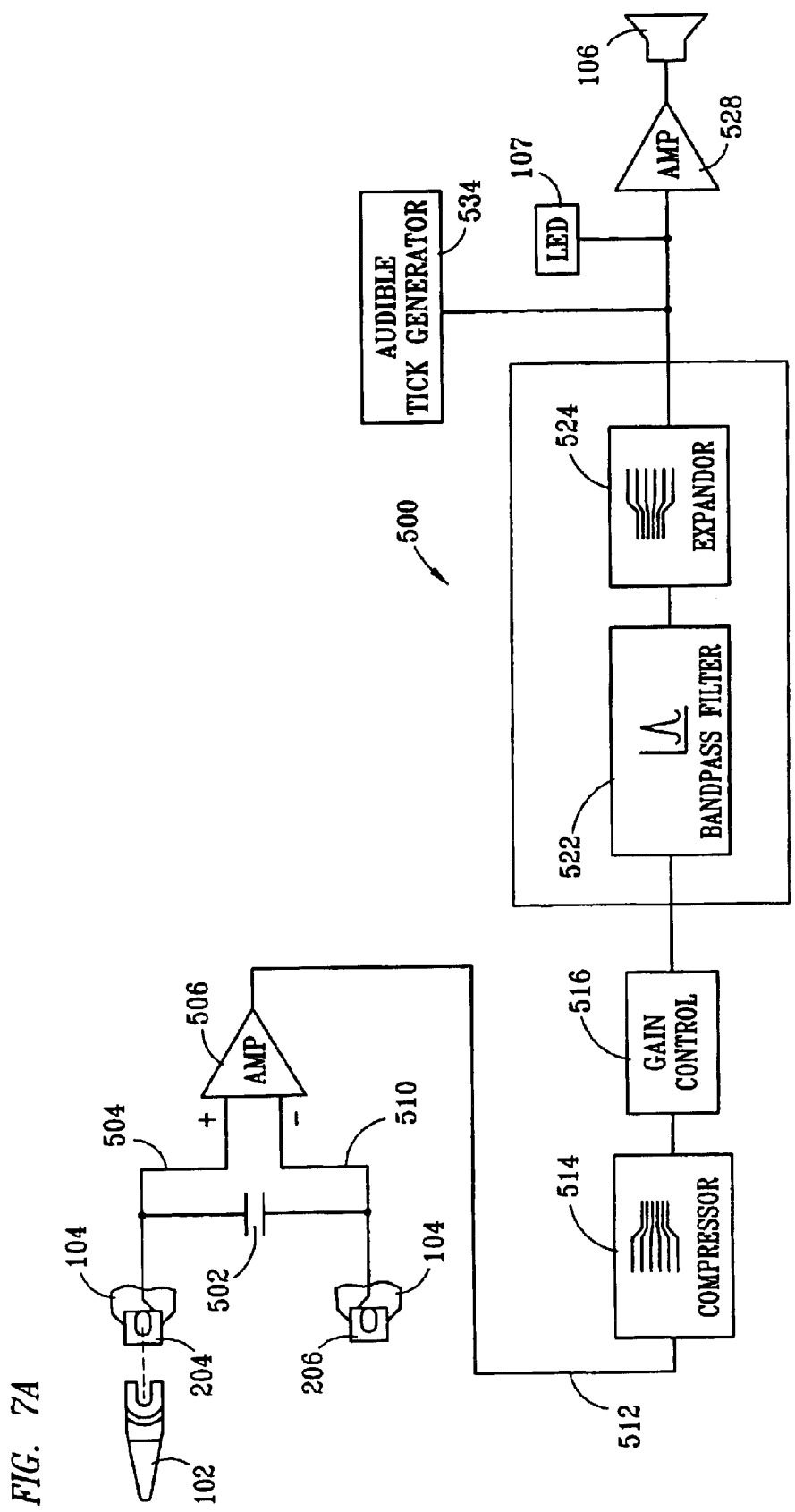
Figure 7B:
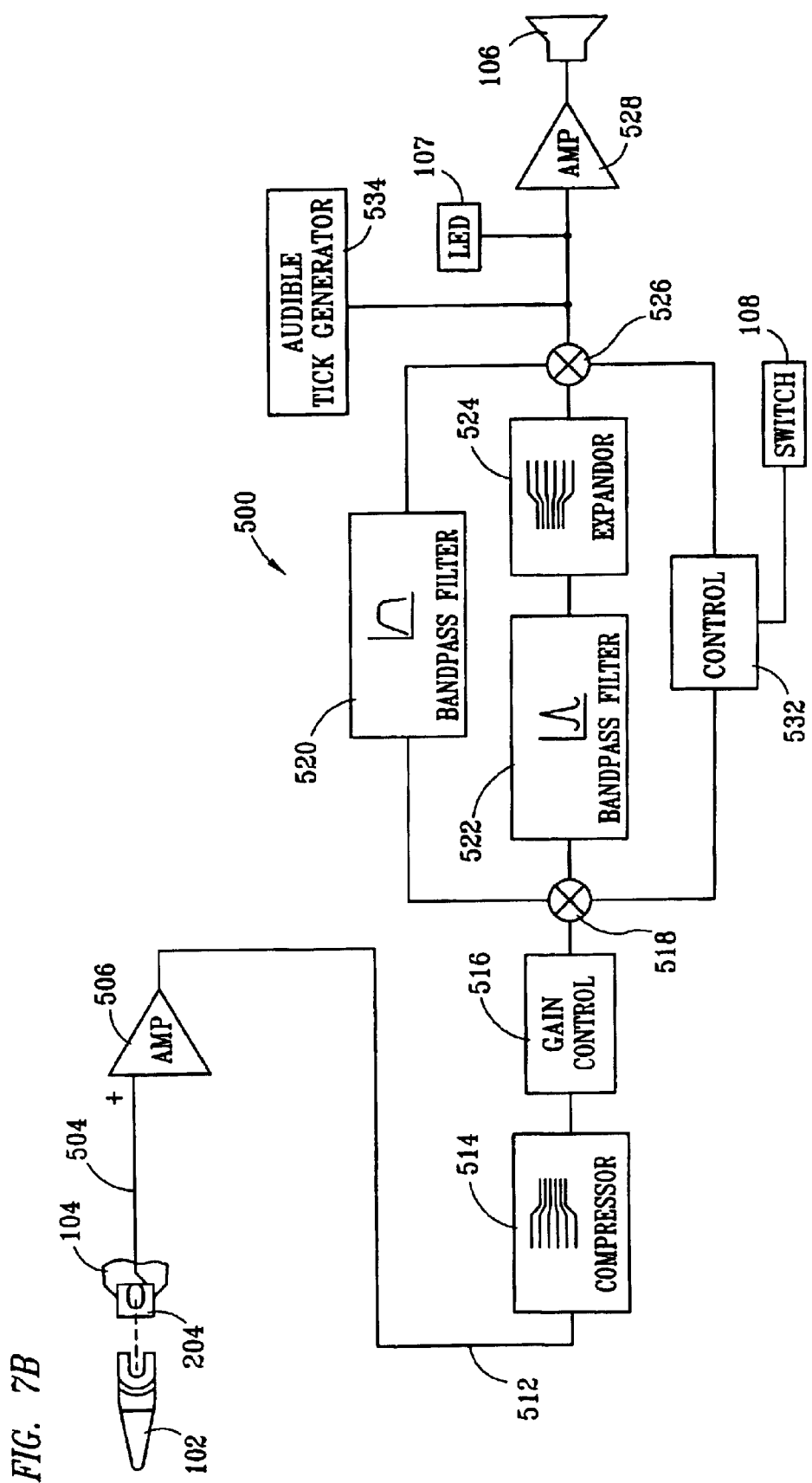

It is understood that the present invention may take many forms and embodiments. Accordingly, several variations may be made in the foregoing without departing from the spirit or the scope of the invention. For example, as shown in FIG. 6, the expandor 524 may optionally be omitted, or as shown in FIG. 7, the compressor 514 may optionally be omitted. As shown in FIG. 7A, the bandpass filter 520, the control circuitry 532, and the switches 108, 518, and 526 and may optionally be omitted from the tone probe if it is not necessary to sense signals as done in the prior art. As shown in FIG. 7B, the noise canceling antenna 206 may optionally also be omitted with some loss of noise canceling. The bandpass filters 520 and 522 may, alternatively, be replaced by any of a number of different filters, such as a digital filter (discussed below), a comb filter, a notch filter, multiple bandpass section filters.

Figure 8:
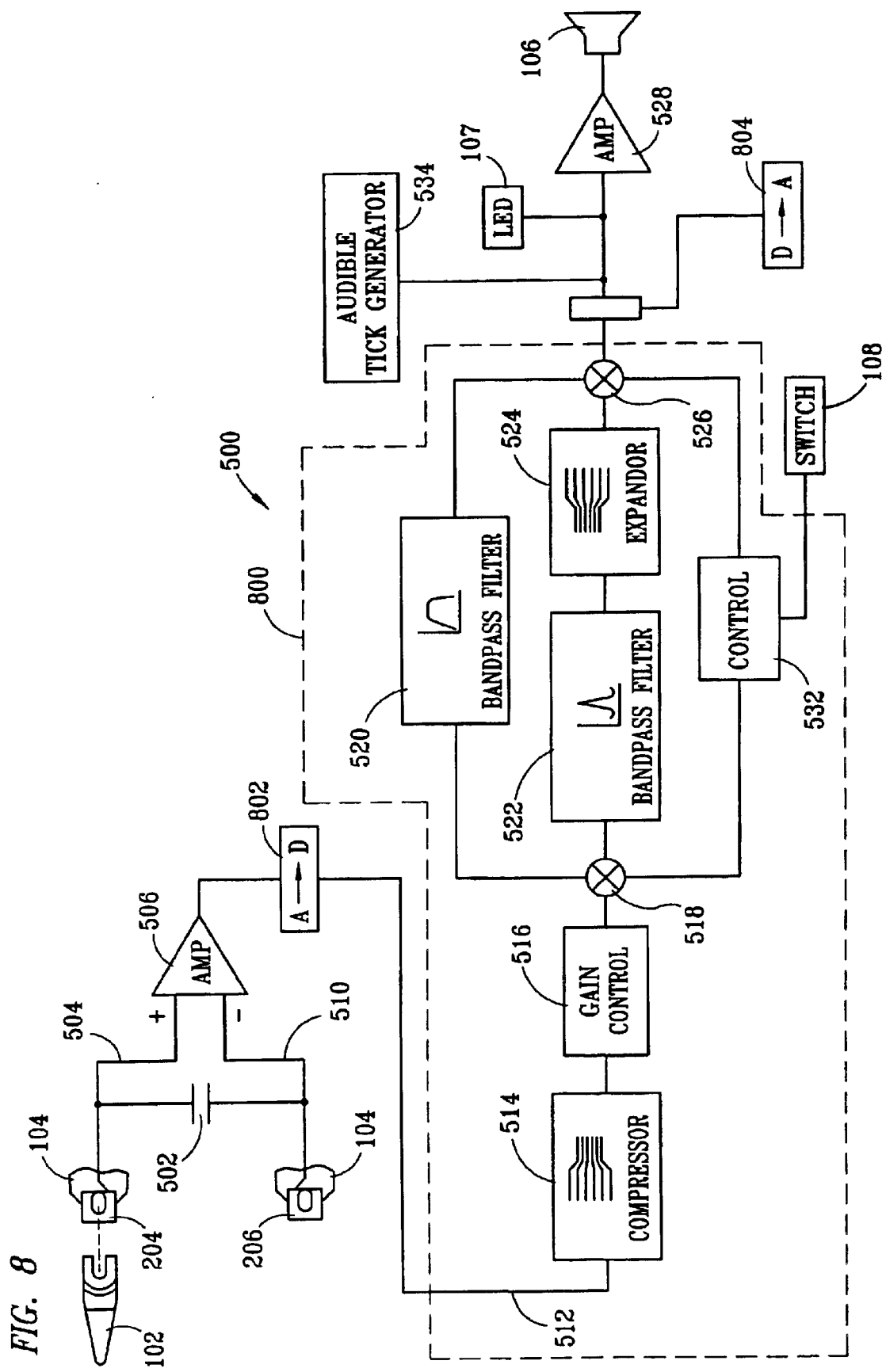
FIGS. 8–10 are schematic diagrams illustrating alternate embodiments for implementing the circuitry of FIG. 5 using digital signal processing.
Figure 9:
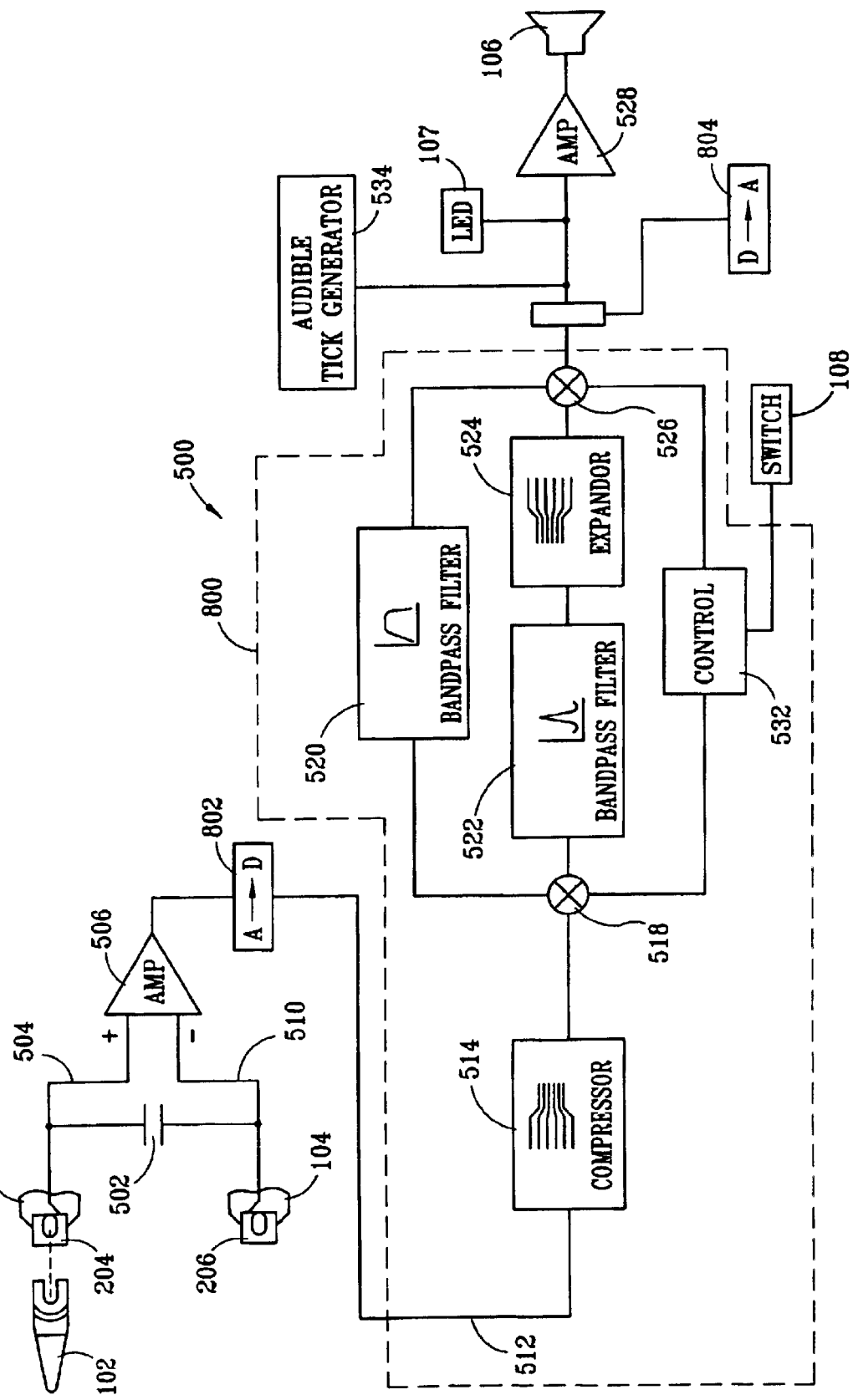
Figure 10:
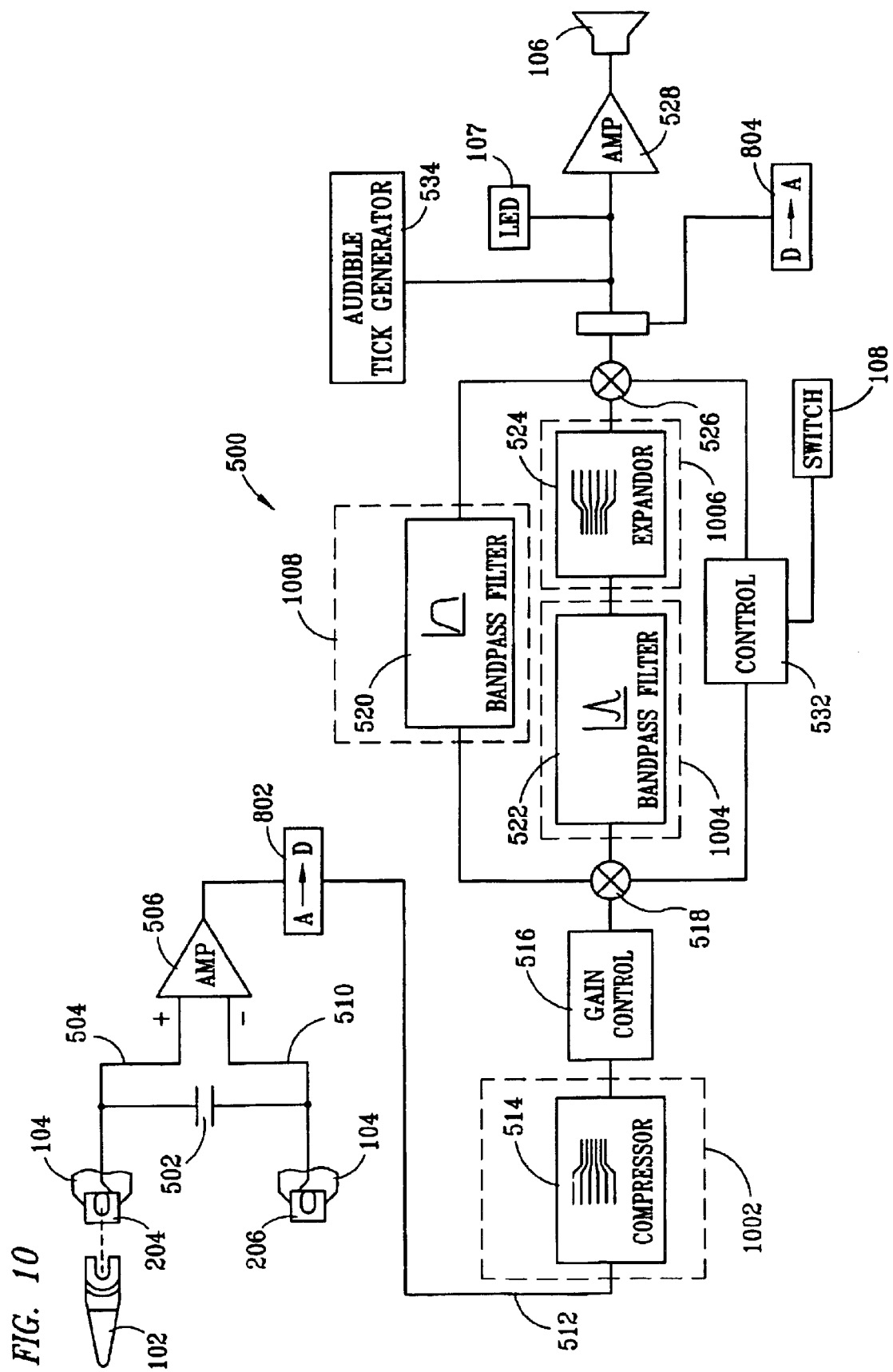

The present invention may be used more generally in a number of different digital signal processing (DSP) applications where filtration of one or more frequencies and attenuation of other frequencies is desired. The present invention may, in part or in whole, be implemented using DSP. More specifically, any one or more of the compressor 514, gain control 516, switches 518 and 526, bandpass filters 520 and 522, expandor 524, and/or control circuit 532, may be implemented using DSP. By way of example, as shown in FIG. 8, the compressor 514, gain control 516, switches 518 and 526, bandpass filters 520 and 522, expandor 524, and control circuit 532 are shown in dashed outline representing a single DSP chip 800 onto which such components of the filtration system 500 are integrated. An analog-to-digital (A/D) converter 802 and a digital-to-analog (D/A) converter 804 are suitably positioned for interfacing the DSP chip 800 with the rest of the probe 100 in the embodiment of FIG. 8. The embodiment of FIG. 8 may also be modified, as shown in FIG. 9, to omit the gain control 516. As shown in FIG. 10, the compressor 514, bandpass filter 522, the expander 524, the bandpass filter 520 may individually be formed on a single respective DSP chips 1002, 1004, 1006, and 1008. DSP chips are well known in the art, and it is considered that, upon a reading of the present description of the invention, a person having ordinary skill in the art could engineer DSP chips, including the required power supply, external memory, crystals, and the like, required to implement DSP. Therefore, the details of implementing the foregoing aspects of the invention using DSP will not be described in further detail herein.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered obvious and desirable by those skilled in the art based upon a review of the foregoing description of preferred embodiments. Accordingly, it is appropriate that the appended claims be construed broadly and in a manner consistent with the scope of the invention.

What is claimed is:

1. A method for detecting a desired signal in an electromagnetically noisy environment, the method comprising:

detecting with a first antenna electromagnetic signals comprising a noise signal and the desired signal;

detecting with a second antenna electromagnetic signals comprising substantially the noise signal; and inverting the noise signal detected by the second antenna, and summing the inverted noise signal to the desired signal detected by the first antenna to generate a summed signal;

compressing the summed signal using digital signal processing (DSP) to generate a compressed signal;

filtering the compressed signal using DSP to generate a filtered signal comprising substantially the desired signal; and expanding the filtered signal using DSP.

2. A method for detecting a desired signal in an electromagnetically noisy environment, the method comprising:

detecting with a first antenna electromagnetic signals comprising a noise signal and the desired signal;

detecting with a second antenna electromagnetic signals comprising substantially the noise signal; and inverting the noise signal detected by the second antenna, and summing the inverted noise signal to the desired signal detected by the first antenna to generate a summed signal;

filtering the summed signal using digital signal processing (DSP) to generate a filtered signal comprising substantially the desired signal; and expanding the filtered signal using DSP.

3. A method for detecting a desired signal in an electromagnetically noisy environment, the method comprising:

detecting with a first antenna electromagnetic signals comprising a noise signal and the desired signal;

detecting with a second antenna electromagnetic signals comprising substantially the noise signal; and inverting the noise signal detected by the second antenna, and summing the inverted noise signal to the desired signal detected by the first antenna to generate a summed signal;

compressing the summed signal using digital signal processing (DSP) to generate a compressed signal; and filtering the compressed signal using DSP to generate a filtered signal comprising substantially the desired signal.

4. A method for detecting a desired signal in an electromagnetically noisy environment, the method comprising:

detecting an electromagnetic analog signal comprising a noise signal and the desired signal;

converting the electromagnetic analog signal into a digital signal;

compressing the digital signal using digital signal processing (DSP) to generate a compressed signal;

filtering the compressed signal using DSP to generate a filtered signal comprising substantially the desired signal;

expanding the filtered signal using DSP to generate an expanded digital signal; and converting the expanded digital signal into an analog form.

5. The method of claim 4 wherein the desired signal is a known signal.

6. The method of claim 4 wherein the desired signal is a signal on a metallic conductor.

7. The method of claim 4 wherein the step of detecting the electromagnetic analog signal is performed by a first antenna, and wherein the method further comprises:

detecting with a second antenna electromagnetic signals comprising substantially the noise signal; and inverting the noise signal detected by the second antenna, and summing the inverted noise signal to the desired signal detected by the first antenna for the step of compressing.

8. The method of claim 4 further comprising the step of amplifying the compressed signal.

9. The method of claim 4 further comprising the step of generating an audible sound indicative of the expanded digital signal.

10. The method of claim 4 wherein the DSP includes a first filter, and wherein the method further comprises controlling whether the compressed signal is directed through the first filter or through a second filter connected in parallel with the first filter and an expandor.

11. A method for detecting a desired signal in an electromagnetically noisy environment, the method comprising:

detecting electromagnetic analog signals comprising a noise signal and the desired signal;

converting the electromagnetic analog signals into a digital signal;

compressing the digital signal using digital signal processing (DSP) to generate a compressed signal;

filtering the compressed signal using DSP to generate a filtered signal comprising substantially the desired signal.

12. The method of claim 11 wherein the desired signal is a known signal.

13. The method of claim 11 wherein the desired signal is a signal on a metallic conductor.

14. The method of claim 11 wherein the step of detecting electromagnetic analog signals is performed by a first antenna, and wherein the method further comprises:

detecting with a second antenna electromagnetic analog signals comprising substantially the noise signal; and inverting the noise signal detected by the second antenna, and summing the inverted noise signal to the desired signal detected by the first antenna for the step of compressing.

15. The method of claim 11 wherein the DSP includes a first filter, and wherein the method further comprises controlling whether the compressed signal is directed through the first filter or through a second filter connected in parallel with the first filter.

16. A method for detecting a desired signal in an electromagnetically noisy environment, the method comprising:

detecting electromagnetic analog signals comprising a noise signal and the desired signal;

converting the electromagnetic analog signals into a digital signal; filtering the digital signal using digital signal processing (DSP) to generate a filtered signal comprising substantially the desired signal; and expanding the filtered signal using DSP.

17. The method of claim 16 wherein the desired signal is a known signal.

18. The method of claim 16 wherein the desired signal is a signal on a metallic conductor.

19. The method of claim 16 wherein the step of detecting electromagnetic analog signals is performed by a first antenna, and wherein the method further comprises:

detecting with a second antenna electromagnetic signals comprising substantially the noise signal; and inverting the noise signal detected by the second antenna, and summing the inverted noise signal to the desired signal detected by the first antenna for the step of filtering.

20. The method of claim 16 wherein the DSP includes a first filter, and wherein the method further comprises controlling whether the compressed signal is directed through the first filter or through a second filter connected in parallel with the first filter.

\* \* \* \* \*